United States Patent
Ronay

(10) Patent No.: US 6,964,923 B1
(45) Date of Patent: Nov. 15, 2005

(54) SELECTIVE POLISHING WITH SLURRIES CONTAINING POLYELECTROLYTES

(75) Inventor: Maria Ronay, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 289 days.

(21) Appl. No.: 09/577,347

(22) Filed: May 24, 2000

(51) Int. Cl.$^7$ .............................................. H01L 21/00
(52) U.S. Cl. ....................... 438/689; 438/690; 438/691
(58) Field of Search ................................. 438/689, 690, 438/691

(56) References Cited

U.S. PATENT DOCUMENTS

| | | | | |
|---|---|---|---|---|
| 5,645,736 A | * | 7/1997 | Allman | 106/6 |
| 5,801,082 A | * | 9/1998 | Tseng | 438/424 |
| 5,814,236 A | * | 9/1998 | Booth | 216/23 |
| 5,861,055 A | * | 1/1999 | Allman et al. | 106/11 |
| 5,876,490 A | * | 3/1999 | Ronay | 106/3 |
| 5,965,465 A | | 10/1999 | Rath et al. | 438/745 |
| 5,968,280 A | * | 10/1999 | Ronay | 134/1 |

FOREIGN PATENT DOCUMENTS

EP 846740 A1 * 6/1998 ............ C09G 1/02

* cited by examiner

Primary Examiner—Robert Kunemund
Assistant Examiner—Matthew Song
(74) Attorney, Agent, or Firm—Connolly, Bove, Lodge & Hutz, LLP; Robert M. Trepp

(57) ABSTRACT

Polishing rate selectivity is increased by providing a polyelectrolyte in the polishing slurry. The polishing selectivity of silicon oxide to silicon nitride is enhanced by using an anionic polyelectrolyte. The polishing selectivity of metals to silicon oxide, silicon nitride and/or silicon oxynitride is increased by using a cationic polyelectrolyte.

24 Claims, No Drawings

SELECTIVE POLISHING WITH SLURRIES CONTAINING POLYELECTROLYTES

FIELD OF THE INVENTION

The present invention relates to slurry compositions. The slurry compositions are useful for polishing and especially for planarizing surfaces in the microelectronics industry.

More particularly the present invention relates to increasing selective polishing rates by employing slurry compositions containing polyelectrolytes. Anionic polyelectrolytes increase the selectivity rate of silicon dioxide to silicon nitride. Cationic polyelectrolytes increase the selectivity polishing rate of metals to silicon dioxide, silicon nitride and/or silicon oxynitride.

BACKGROUND OF INVENTION

In the fabrication of microelectronics components, a number of steps involved are polishing, especially surfaces for chemical-mechanical polishing for the purpose of recovering a selected material and/or planarizing the structure.

Accordingly, over the years, a number of vastly different types of polishing processes to remove material, sometimes in selective areas, have been developed and are utilized to varying degrees.

In many microelectronics applications a $Si_3N_4$ layer is deposited under a $SiO_2$ layer to serve as a polish stop. The role of such polish stop is particularly important in Shallow Trench Isolation (STI) structures. Selectivity is characteristically expressed as the ratio of the oxide polish rate to the nitride polish rate. State of the art polishing slurries such as silica slurry at alkaline pH, or ceria slurry at neutral or alkaline pH have an oxide to nitride selectivity of about 3. Such ratio is not high enough for the nitride to adequately serve as a polish stop.

It could also therefore be desirable to provide a polishing procedure which achieved excellent removal of silicon dioxide along with exhorting an increased polishing selectivity rate as compared to silicon nitride.

Also in other microelectrics structures, a layer of silicon dioxide, silicon nitride and/or silicon oxynitride insulator is located beneath a metal layer such as a copper, tungsten or aluminum layer and a liner such as Ti, TiN, Ta and TaN to act as a polish stop. If the polishing rate selectivity of the metal to the underlying silicon dioxide, silicon nitride and/or silicon oxynitride can be increased, the liner might possibly be eliminated.

It could also therefore be desirable to provide a polishing procedure which achieves excellent removal of a metal along with exhibiting an increased polishing selectivity rate as compared to silicon dioxide, silicon nitride and/or silicon oxynitride.

SUMMARY OF THE INVENTION

The present invention provides for increasing the polishing rate ratio of silicon dioxide to silicon nitride by including a polyelectrolyte in the polishing slurry. The present invention also provides for increasing the rate ratio of a metal to silicon dioxide, silicon nitride and/or silicon oxynitride, by including a polyelectrolyte in the polishing slurry.

More particularly, an aspect of the present invention relates to a polish composition comprising abrasive particles and about 0.05 to about 5% by weight of an anionic polyelectrolyte or a cationic polyelectrolyte.

Another aspect of the present invention relates to a method for polishing a silicon dioxide surface which is in contact with silicon nitride by providing on the silicon dioxide a composition comprising abrasive particles and an anionic polyelectrolyte in an amount sufficient to increase the polishing rate ratio of the silicon dioxide to silicon nitride.

Another aspect of the present invention relates to a method for polishing a metal surface which is in contact with silicon dioxide, silicon nitride and/or silicon oxynitride by providing on the metal surface a slurry comprising abrasive particles and a cationic polyelectrolyte in an amount sufficient to increase the polishing rate ratio of the metal to the silicon dioxide, silicon nitride and/or silicon oxynitride.

BEST AND VARIOUS MODES IN CARRYING OUT INVENTION

According to the present invention a polishing slurry that contains abrasive particles and polyelectrolytes is provided. The polyelectrolytes increase the polishing rate selectivity of certain surfaces depending upon the type of polyelectrolytes employed. In particular, anionic polyelectrolytes increase the polishing rate selectivity of silicon dioxide as compared to silicon nitride.

On the other hand, cationic polyelectrolytes increase the polishing rate selectivity of metals as compared to silicon dioxide, silicon nitride and/or silicon oxynitride.

According to the present invention, in order to achieve increased selectivity, the quantity of polyelectroltyes in the abrasive composition is in excess of the amount which adsorbs on the surface of the abrasive particles and therefore is present to some extent in the composition as free or unabsorbed polyelectrolyte. The polyelectrolyte is typically added to the abrasive composition in an amount of at least about 0.05% by weight and more typically about 0.05 to about 5% of weight and preferably about 0.3 to about 1% by weight.

While a fraction of the polyelectrolyte may adsorb on the surface of the abrasive particles, the rest of the polyelectrolyte is in the supernatant part of the slurry. It is this portion of the polyelectrolyte which controls the polish rate selectivity.

Anionic polyelectrolytes contemplated for use according to the present invention can contain acidic groups such as carboxyl groups, for example in poly(acrylic acid), poly (methacrylic acid), poly(methyl methacrylic acid), poly(maleic acid), saturated and unsaturated poly(carboxylic acids) and copolymers thereof. Also, phosphoric acid and/or sulfonic acids groups can be incorporated into a polymer and may act as acidic functional group such as poly(vinylsulfonic acid).

Cationic polyelectroltyes contemplated for use according to the present invention can contain basic groups including nitrogen-containing groups, such as polymers with amino, amide, imide, vinyl pyridine, piperidine and piperazine derivatives. Examples of specific cationic polyelectrolytes are poly(vinylamine), poly(ethylenimine) and poly(4-vinylpryridine).

Typically the polyelectrolytes employed according to the present invention have relatively low molecular weights of less than about 100,000 and more typically about 300 to about 20,000 weight average molecular weight.

Examples of suitable abrasive particles include alumina, ceria, silica, and zirconia. The abrasives typically have a particle size of about 30 to about 1000 nanometers and preferably about 75 to about 300 nanometers.

The amount of abrasive particles is typically about 0.1 to about 20 percent by weight and more typically about 0.3 to about 2 percent of weight.

The slurry can include other ingredients in addition to the abrasive and polyelectrolyte such as dispersing agents and oxidizing agents, if desired.

The slurry is preferably an aqueous slurry, though non-water-based slurries or a mixture of water based and non-water-based slurries are included in the present invention.

The parameters of the polishing or planarizing can be determined by those skilled in the art, once aware of this disclosure, without exercising undue experimentation. For instance, the speed of rotation of the polishing pads and also of the wafer is about 10 to about 150 rpm and pressure about 2 to 10 psi. A wafer may be in the range of 100 to 300 mm in diameter.

The following non-limiting examples are presented to further illustrate the present invention.

Example 1

A polishing slurry is prepared by dissolving in water, poly(acrylic acid) having a molecular weight of 2,000 in a concentration of about 0.5 percent by weight. Next, a ceria suspension in water of neutral pH is added to the solution with stirring. The pH at this point is less than 3. The stirring is continued for about 20 minutes permitting a portion of the poly(acrylic acid) to adsorb on the surface of the ceria particles with the remainder being present in the supernatant portion of the slurry. The pH of the slurry is adjusted to about 4.4–4.5 by adding KOH pellets.

Table 1 shows the oxide and nitride polish rates on STI structures for polishing with the above slurry of 0.75 wt. % ceria, 0.5 wt % PAA at pH=4.47. The polishing was carried out using a IC1000 K groove-polishing pad over Suba IV polishing pad. The downforce was 5 psi, the table and carrier rotation 100 rmp, slurry flow rate was 200 ml/minute.

TABLE 1

| Wafer ID | extent of polish | polish time (sec.) | oxide mean (A) | nitride mean (A) |
|---|---|---|---|---|
| AA | On target | 155 | 3,916 | 1,169 |
| BB | overpolished | 180 | 3,405 | 1,162 |

The table shows that during 25 seconds (180–155) overpolish 511 Angstroms (3,916–3,405) of oxide while only 7 Angstroms of nitride (1,169–1,162) were removed giving an oxide to nitride selectivity of 73. It is the selectivity in patterned device structures that is most relevant to practical applications.

The dissociation of PAA to polyacrylate anion and hydrogen ion increases as a function of pH. under pH 3, PAA is essentially uncharged and it is fully ionized at pH 10. The adsorption of PAA on $Si_3N_4$ is also pH dependent. Maximum adsorption occurs at pH 3, while the amount of PAA adsorbed decreases with increasing pH; the adsorbed amount is rather small at pH 9. Using the polishing slurry described above with pH of about 4.4, the degree of ionization of PAA is about 0.1, yet the adsorption of $Si_3N_4$ is large. This implies that the undissociated PAA adsorbs on the $Si_3N_4$ surface by chemical/hydrogen bonding while the (dissociated)polyacrylate anions adsorb on the overall positively charged $Si_3N_4$ surface by electrostatic attraction. Due to both mechanisms adsorption of PAA on $Si_3N_4$ surface at this pH is large. Also, with this ratio of ceria/PAA enough PAA remains in the supernatant to adsorb on the $Si_3N_4$. The adsorption of PAA on $Si_3N_4$ hinders the polishing of $Si_3N_4$. However, no PAA adsorbs on $SiO_2$ since there is electrostatic repulsion of PAA and the negatively charged $SiO_2$ surface. Thus the $SiO_2$ polish rate does not decrease. These phenomena leads to increased polish rate selectivity.

Example 2

A polishing slurry is prepared according to the procedure shown in Example 1 except that the slurry combines about 0.5% poly(acrylic acid) and about 1% ceria.

Table 2 shows the oxide to nitride selectivity in case of blanket $SiO_2$ and $Si_3N_4$ wafers, using IC1000 perforated pads over Suba IV pads; and the polishing conditions as in Example 1.

TABLE 2

| Slurry | PH | oxide rate A/min | nitride rate A/min | selectivity |
|---|---|---|---|---|
| 1.0% ceria 0.5% PAA | 4.47 | 585 | 111 | 5.27 |

The selectivity is not as high as in Example 1 possibly because there is less PAA in the supernatant (more adsorbed on more ceria) in this Example.

Example 3

Results similar to those from Example 2 are obtained by adding polyacrylic acid to acidic silica slurries. Since the PAA barely adsorbs on the negatively charged $SiO_2$ particles, a larger fraction of the PAA will be in the supernatant, thus a lesser amount of PAA additive will suffice. The preferred pH for chemisorption of PAA on $Si_3N_4$ in this example is pH2–4.

Example 4

The amount of PAA in the supernatant also depends on the pH of the slurry. In the alkaline pH regime such as pH 10 and above, PAA is completely dissociated and the electrostatic repulsion between ionized polymer segments impedes the accumulation of such segments at the ceria abrasive surface, which results in reduced adsorption thus more PAA in the supernatant. At this pH there are OH—, H+ and $NH_4+$ ions on the surface of $Si_3N_4$, thus some of PAA ions can adsorb at the positive sites of the surface. This is in contrast to the all around coverage of the surface at acidic pH. Table 3 shows the oxide, nitride polish rates on blanket wafers using a slurry of 1.0% ceria, 0.1% PAA at pH of 11.07 giving an oxide/nitride selectivity of 8.86 that is still higher than that of 3 obtained without the use of a polyelectrolyte.

TABLE 3

| Slurry | PH | oxide rate A/min | nitride rate A/min | selectivity |
|---|---|---|---|---|
| 1.0% ceria 0.1% PAA | 11.07 | 5,000 | 564 | 8.86 |

Example 5

Results similar to those from Example 4 are obtained by adding polyacrylic acid to conventional silica slurries which have an alkaline pH. It has been determined that the preferred pH of the final slurry in this case is 10–11.

Comparison Example A

This example illustrates that the use of a cationic polyelectrolyte does not provide for improved polishing rate selectivity of silicon dioxide to silicon nitride.

Table 4 gives oxide and nitride polish rates when a slurry of 1.0 wt % ceria and 0.13 wt. % polyethylenimine (PEI) of molecular weight 700 was used at a pH of 10.6. Both oxide and nitride polish rates diminished to 34 and 18 Angstroms per minute respectively, and the selectivity is 1.9.

TABLE 4

| Slurry | PH | Oxide rate A/min | Nitride rate A/min | selectivity |
|---|---|---|---|---|
| 1.0% ceria 0.13% PEI | 10.6 | 34 | 18 | 1.9 |

Example 6

Slurries containing cationic polyelectrolyte such as polyethylenimine can be used for polishing a metal such as W, Cu or Al where the slurry would stop on an underlying silicon dioxide or silicon nitride structure. The preferred abrasives for such purpose are ceria and alumina. Use of silica abrasives is not especially preferred since cationic polyelectrolytes are strongly adsorbed on the silica abrasive diminishing the metal polish rate.

What is claimed is:

1. A method for polishing a silicon dioxide surface in contact with a silicon nitride which comprises providing on the silicon dioxide surface a slurry comprising abrasive particles and an anionic polyelectrolyte in an amount sufficient to increase the polishing rate ratio of the silicon dioxide to the silicon nitride and contact said surface with a polishing pad.

2. The method of claim 1 wherein the polyelectrolyte has a molecular weight of less than about 100,000.

3. The method of claim 1 wherein the polyelectrolyte is selected from the groups consisting of poly(acrylic acid), poly(methacrylic acid), poly(methyl methacrylic acid), poly(maleic acid), and poly(vinylsulfonic acid).

4. The method of claim 1 wherein the polyelectrolyte is poly(acrylic acid).

5. The method of claim 1 wherein the amount of the abrasive particles is about 0.1 to about 20 percent by weight.

6. The method of claim 1 wherein the polyelectrolyte has a molecular weight of about 300 to about 20,000.

7. The method of claim 1 wherein the abrasive particles comprise a member selected from the group consisting of ceria, alumina, silica and zirconia.

8. The method of claim 7 wherein the abrasive particles comprise a member selected from the group consisting of ceria, alumina, silica and zirconia.

9. The method of claim 1 wherein the amount of abrasive particles is about 0.3 to about 2 percent by weight.

10. The method of claim 9 wherein the amount of abrasive particles is about 0.3 to about 2 percent by weight.

11. The method of claim 1 wherein the amount of said polyelectrolyte is about 0.05 percent by weight.

12. The method of claim 11 wherein the amount of said polyelectrolyte is about 0.05 percent by weight.

13. The method of claim 1 wherein the amount of said polyelectrolyte is about 0.05 to about 5 percent by weight.

14. The method of claim 13 wherein the amount of said polyelectrolyte is about 0.05 to about 5 percent by weight.

15. The method of claim 1 wherein the amount of polyelectrolyte is about 0.3 to about 1 percent by weight.

16. The method of claim 15 wherein the amount of polyelectrolyte is about 0.3 to about 1 percent by weight.

17. The method of claim 1 wherein the slurry is an aqueous slurry.

18. The method of claim 7 wherein the slurry is an aqueous slurry.

19. A method for polishing a metal surface which is in contact with at least one member elected from the group consisting of silicon dioxide, silicon nitride and silicon oxynitride which method comprises providing on the metal surface a slurry comprising abrasive particles and a cationic polyelectrolyte in an amount sufficient to increase the polishing rate ratio of the metal to said member and contacting said surface with a polishing pad.

20. The method of claim 19 wherein the polyelectrolyte is selected from the group consisting of poly(vinylamine), poly(ethylenimine), and poly(4-vinylpryridine).

21. The method of claim 19 wherein the polyelectrolyte is polyethylenimine.

22. The method of claim 19 wherein the metal is W, Cu or Al.

23. The method of claim 19 wherein the polyelectrolyte has a weight of less than about 100,000.

24. The method of claim 19 wherein the polyelectrolyte has a molecular weight of about 300 to about 20,000.

* * * * *